United States Patent [19]
Weihe et al.

[11] Patent Number: 5,365,629
[45] Date of Patent: Nov. 22, 1994

[54] APPARATUS FOR WASHING OUT FLEXOGRAPHIC PRINTING PLATES

[75] Inventors: Hans-Peter Weihe, Frankfurt; Herbert Konermann, Lengerich, both of Germany

[73] Assignee: E. I. du Pont de Nemours and Company, Wilmington, Del.

[21] Appl. No.: 117,452

[22] Filed: Sep. 7, 1993

[30] Foreign Application Priority Data

Sep. 17, 1992 [DE] Germany ............................. 4231106

[51] Int. Cl.$^5$ .................... B08B 11/02; A46B 13/02
[52] U.S. Cl. ......................................... 15/77; 15/102
[58] Field of Search .................... 15/77, 102; 118/112, 118/114, 115, 121, 223, 224, 227, 239, 244

[56] References Cited

U.S. PATENT DOCUMENTS

4,213,420  7/1980  Martino ........................... 118/713

FOREIGN PATENT DOCUMENTS

0225678  6/1987  European Pat. Off. .

*Primary Examiner*—Edward L. Roberts

[57] ABSTRACT

A device for washing out flexographic printing plates. The device includes a tank, brushes, a first turning roll and a plate conveying mechanism. The tank is for holding a liquid bath. The brushes are adapted to be at least partly immersed in the liquid bath and are for washing front sides of the plates. The conveying mechanism is for conveying the plates in a first conveying direction past the rotatable brushes where the front sides of the plates are cleaned by the brushes and then partially around the first turning roll changing the direction of motion of the printing plates. The turning roll is designed as a cleaning brush which is adapted to clean back sides of the printing plates.

15 Claims, 3 Drawing Sheets

APPARATUS FOR WASHING OUT FLEXOGRAPHIC PRINTING PLATES

BACKGROUND OF THE INVENTION

1. Field of the Invention

The invention concerns an apparatus for washing out flexographic printing plates with a large number of rotating brushes which are at least partly immersed in a liquid bath and with a turning roll arranged behind the brushes in the direction of conveying which changes the direction of motion of the printing plates.

2. Description of Related Art

In a known device of this type (EP 0 225 678 B1) the printing plates are pulled through the device by pull rods to which they are clamped. The pull rods are suspended on hooks which in turn are affixed to a conveyer belt. The conveyer belt simultaneously forms a rest for the printing plates so that they cannot move aside when being driven past the rotating brushes. The rotating brushes remove the photopolymers not polymerized during a previous exposure so that, depending on the design of the printing plate, at the end of the washing out process a positive or negative image remains in the form of relief on the printing plate.

During the process a certain fouling of the printing plates is unavoidable. Dirt particles adhering to the printing plates eventually lead to an accumulation of dirt particles on the printing cylinders which reduces the accuracy of the mounting of the printing plates on the printing cylinders and thus impairs the printed result achieved.

The invention therefore has the task of improving the cleaning of the printing plates.

SUMMARY OF THE INVENTION

This problem is solved by the device of the type mentioned initially by the fact that the turning roll is designed as a cleaning brush which cleans the back sides of the printing plates.

The front side of the printing plates is already cleaned during the washing out process where not only the unpolymerized photopolymers but also any dirt particles adhering are removed. The back side is now cleaned by the turning roll. In this case the turning roll is used twice so that the additional cleaning effect is not at the expense of an increase in the size of the device or the use of additional parts.

The cleaning of the back side of the printing plate is already known from U.S. Pat. No. 4,213,420. Here the printing plate is passed through a gap formed by two brush rolls of which at least the brush facing the image side of the printing plate is rotating. However, a number of additional processing stations are connected to this roll gap in which the plate is again charged with liquids or squeezed by rolls.

In a preferred version, the peripheral velocity of the turning roll differs from the velocity of motion of the printing plates. Therefore, when the printing plates pass by, a relative velocity exists between the printing plates and the turning rolls. This very decisively improves the cleaning effect.

It is also preferred for the turning roll to rotate in the direction opposite the conveying direction. Normally the turning rolls rotate in the same direction as the conveying. Reversing the direction of rotation of the turning roll abandons this principle, but the cleaning effect is even further improved by this. The relative velocity between printing plate and turning roll can be increased.

A further improvement in the cleaning effect can be achieved by providing a brush roll which engages with the turning roll in the absence of printing plates, which is at least partly immersed in the cleaning fluid. The brush roll as it rotates is wetted by the cleaning fluid and releases this cleaning fluid at least partly onto the turning roll upon further rotation. The back side of the printing plates can thus be cleaned while moist.

In this case it is preferred for the brush roll to be matched with a wiper blade which strips the cleaning liquid off it. In this way the quantity of cleaning fluid transferred to the turning roll is kept relatively small. The turning roll is therefore not brought into a wet state but only a moist state. As a result no measures need be taken to handle the cleaning fluid draining off the back side of the printing plates.

Besides this, this wiper dries the brush roll to such an extent that although it is moist, it is usually less wet than the image side of the printing plate wetted by the foregoing rotating brushes. The brush roll thus leads to a drying of the image side, therefore the relief surface of the printing plate. By use of a brush roll this drying is not limited to simple wiping off of the surface which under some conditions could lead to damage to the relief. Rather the brush roll is capable of, so to speak, blotting the surface of the printing plate and thus producing drying which practically does not influence the relief quality. The previous moistening of the brush roll surprisingly increasing the drying effect. It is assumed that a moist brush roll has a greater suction effect than a dry one. Advantageously the wiper can be lifted away from the brush roll. Such a lifting of the wiper may be advisable, for example, when the device is operated in order to bring the turning roll into a sufficient moist state as quickly as possible. If necessary the wiper can also be raised between individual printing plates in order to be able to transfer more cleaning fluid to the cleaning roll. As a rule, however, it is sufficient for the turning roll to engage the only moist brush roll in the pauses between the individual printing plates and receive cleaning liquid transferred from it during this time.

The peripheral velocities of the turning roll and brush roll preferably differ from one another. In the pauses between the individual printing plates, therefore the two rolls clean one another. The brush rolls are additionally cleaned due to the fact that after touching the surface at first they are guided through the cleaning liquid before the cleaning liquid is stripped off by the wiper. Due to the variable peripheral velocities a relative velocity is generated on the surfaces of the two rolls which also improves the transfer of cleaning fluid from the brush roll to the turning roll.

In an especially preferred version a second turning roll is provided which changes the direction of motion of the printing plates into the essentially opposite direction to that during washing, at which time the second turning roll is designed as a drying roll. The printing plates are therefore turned twice, e.g., twice by 90° each time, covering an approximately vertical segment of their circular path between the first and second turning roll. In this way one achieves two advantages. On the one hand the printing plates are not so tightly bent as would be the case with a single turning roll turning the printing plates by 180°. On the other hand the second turning roll can also be used to dry the back side of the printing plates so that the latter can be removed at the exit from the device in an approximately hand dry state.

The second turning roll preferably has a surface of textile material. Felt or sponge cloth have been proven effective for this. The textile materials have relatively good absorption properties so that even in the case of a high throughput of printing plates a sufficient drying can be achieved. It should be remarked that the drying here need not be the final drying. This segment serves to improve and shorten a subsequent drying, e.g., by warm air.

The second turning roll advantageously rotates in the opposite direction to conveying. The second turning roll designed as the drying roll thus wipes the back side of the printing plates off and thus improves drying.

It is also of advantage that the second turning roll rotates more slowly than the turning rolls formed by the cleaning brushes. The difference may be of the order of a factor of 10. While it is desirable during cleaning to achieve a relatively high relative velocity between the roll and the printing plate in order to improve the cleaning result, the relative velocity during drying should be lower in order to facilitate absorption of the liquid which is present here in the form of a thin moist film.

Advantageously each printing plate is affixed to a pull rod which is guided with its ends in a U-shaped profile in the region of the turning roll. The printing plates, as a result of this measure, even in the case of repeated turning, can be guided on or to the turning rolls with sufficient accuracy for the turning rolls to perform their function.

A supporting attachment for the printing plates which can move with the printing plates is preferably provided above the rotating brushes so that the distance between the brushes and the attachment is variable. By varying the distance of the brushes, therefore the spacing between the axis of rotation of the brushes and the supporting attachment, which absorbs the pressure absorbed during the brushing on the printing plates, the force with which the brushes act on the printing plates can be varied, i.e. the force at which the unpolymerized photopolymer is removed from the printing plates. With this measure, fluctuations in the quality of the printing plates and in the properties of the cleaning fluid can be equalized.

In another version, it may be provided that the immersion depth of the brushes in the cleaning fluid is variable. As a result the degree of wetting and with it the quantity of cleaning fluid reaching the printing plates via the brushes can be varied. This also makes it possible, within certain limits, to adapt the parameters or properties of the printing plates and cleaning fluid.

The brushes preferably oscillate transversely to the direction of conveying with a frequency of oscillation of about 80 cycles per minute and rotate at a speed of 30 revolutions per minute. It has been found that a very satisfactory washing-out result can be achieved with these parameters.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

Figure 1:
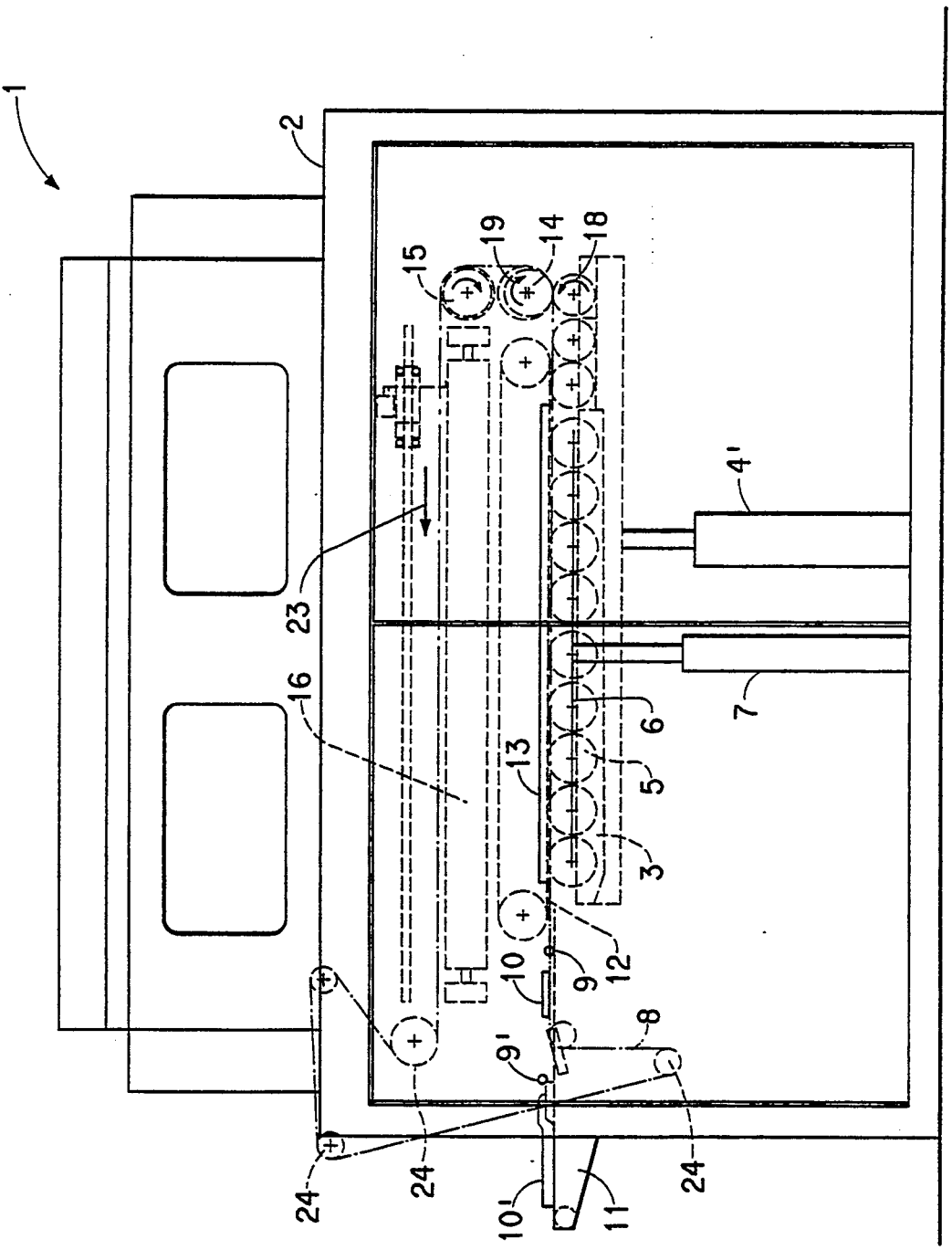
FIG. 1 is a side view of a washing-out apparatus.
Figure 2:
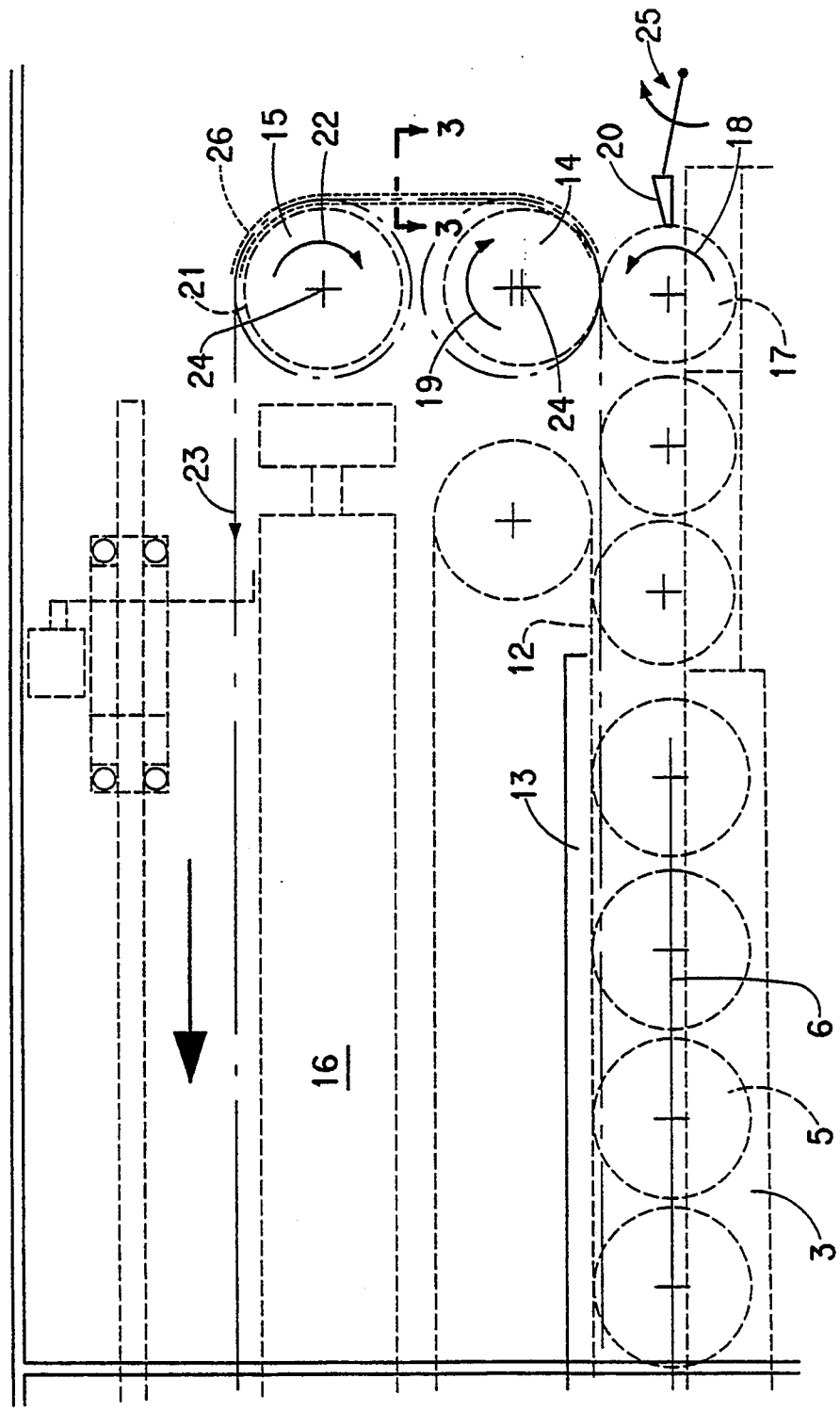
FIG. 2 is a detailed view of the washing-out apparatus.
Figure 3:
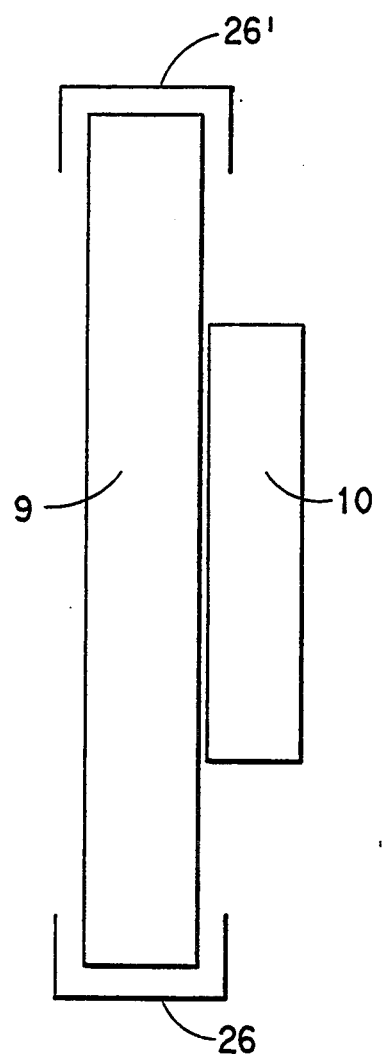
FIG. 3 shows a cross section along line 3—3 in FIG. 2.

Throughout the following detailed description, similar reference characters refer to similar elements in all figures of the drawings.

A washing apparatus or device 1 has a housing 2 in which a tank 3 filled with cleaning liquid is arranged. The tank 3 can be adjusted in height with the aid of a lift mechanism 4. The lift mechanism 4 is shown in the form of a single piston-cylinder unit. It can also consist of several piston-cylinder units or other driving devices.

A row of rotating or rotatable brushes 5 is arranged on a common carrier 6 in such a way that they immerse with at least part of their circumference in the tank 3. The carrier 6 can be adjusted in height with the aid of a lift mechanism 7.

A plate conveying mechanism 8, such as a revolving chain transmission or a chain drive mechanism, is also provided in the housing 2 on which pull rods 9 can be suspended. A printing plate 10 can be attached to each pull rod 9, in which case in the position shown their image side points down. To feed in the printing plates 10, the device 1 has a feeder table 11 on which another printing plate 10' with another pull rod 9' waits for treatment in the device 1.

Above the rotating brushes 5 a revolving or revolveable belt 12 is provided against which the back side of the printing plates 10 rest when the printing plate 10 is guided with its image side down past the rotating brushes 5. The revolving belt 12 lies with its inner side against a plate 13, therefore it can absorb the forces exerted by the rotating brushes 5 on the printing plate 10. With the aid of the lifting mechanism 7 the distance between the rotating brushes 5 and the plate 13 and therefore the force exerted by the rotating brushes 5 on the printing plate 10 is adjustable. By mutually adapted movements of the lift mechanism 4 for the tank 3 and the lift mechanism 7 for the carrier 6 of the rotating brushes 5, the immersion depth of the rotating brushes 5 in the tank 3 and therefore the quantity of fluid absorbed and transferred to the printing plates 10 can be varied.

The chain drive mechanism 8 which naturally can also be formed by a revolving belt, a rope or the like, forms a circular path in the counterclockwise direction in the Figures. This path defines the direction of conveying. Within this path each printing plates 10, 10' changes its direction of motion twice, the first time in the direction of transportation behind the rotating brushes 5 at a first turning roll 14 by 90° upward and on a second turning roll 15 by another 90° left ward. Between the first and second turning rolls a short segment of movement of the printing plates 10 runs in the vertical direction, while the printing plates 10 otherwise move in the horizontal direction. Behind or above the second turning roll 15 the image side of the printing plates 10 being processed by the rotating brushes 5 is now on the top side of the plate 10. In this position the printing plates 10 can be placed on a support attachment 16 and transported transversely to the direction of conveying, therefore in the Figures perpendicular to the plane of the drawing, out of the apparatus 1.

The circumferential velocity of the turning roll 14 can be caused to differ from the velocity of motion of the printing plates 10 attached to the conveying mechanism 8 by means 24 for driving or rotating the conveying mechanism 8, the turning roll 14 and the brush roll 17. The driving means can also be adapted to control the circumferential velocities of the turning roll 14 and the brush roll 17 to differ from one another. The driving means 24 is also adapted to oscillate the brushes 5 at a frequency of about 80 cycles per minute transversely to the direction of conveying and rotate at a speed of about 30 revolutions per minute. The driving means 24 is represented in the Figures as driven rollers and driven roller shafts about which the conveying mechanism 8, the turning roll 14 and the brush roll 17 rotate.

The first turning roll 14 is designed as a cleaning brush. It engages a brush roll 17. This engagement is interrupted when a printing plate 10 is passed between the turning roll 14 and the brush roll 17.

The brush roll 17 and the turning roll 14 rotate in opposite directions, i.e., in the directions of the arrows 18 and 19. While the brush roll 17 rotates counterclockwise, the turning roll 14 rotates in the clockwise direction. The circumferential velocities, however, differ. The directions of rotation 18, 19 have the result that both on the image side and also on the back side of the printing plate 10 movement of the surface of the rolls 14, 17 opposite to that of the surface of the printing plate 10 takes place.

The brush roll 17 has a wiper or blade 20 in a position between the place where the brush roll 17 leaves the tank 3 with cleaning fluid and the place were it comes into contact with the printing plate 10 or turning roll 14. The blade 20 therefore largely strips the liquid absorbed in the tank 3 off from the brush roll 17. The brush roll 17 is accordingly no longer wet but only moist when it comes into contact with the printing plate 10 or the turning roll 14. The quantity of liquid which the brush roll 17 carries with it is sufficient, however, to moisten the turning rolls 14 in each pause or gap between two printing plates 10, 10' so that the turning roll 14 can moist clean (i.e., moisten while cleaning) the back side of the printing plates 10, 10' to a sufficient degree. Wet cleaning with washing fluid should be avoided in order to avoid in advance problems with draining washing or cleaning fluid.

The wiper 20 can be lifted away from the brush roll 17 by lifting means 25. This can be desirable when starting up the device 1 in order to produce more rapid moistening of the turning roll 14. The wiper 20 can also be raised in the pauses or gaps between two printing plates 10 in order to transfer a greater amount of washing fluid to the turning roll 14.

The tank 3 is shown with several chambers here as known from EP 0 225 678 B1. The washing fluid can flow from the tank part into which the brush roll 17 immerses and into which fresh washing fluid is fed into the part where the rotating brushes 5 are arranged.

The brush roll 17 rotates more slowly than the first turning roll 14. Although a certain relative velocity exists between the moving printing plate 10 and the surface of the brush roll 17, the speed of rotation is selected such that the brush roll 17 quasi dabs the surface of the printing plate 10, therefore, performing only very moderate wiping movements on the relief-formed image side of the printing plate 10. The brush roll 17 thus absorbs a great part of washing liquid remaining on the plate 10 after washing out by the rotating brushes 5 on the relief side of the printing plate 10. This side is then not completely dried but it is essentially hand dry so that in subsequent drying steps, drying energy and time can be saved.

The second turning roll 15 is designed as a drying roll. It has a covering 21 of textile material, e.g., of felt or sponge cloth. The second turning roll 15 simultaneously dries the back side of the plate 10 upon the turning of the printing plate 10. The second turning roll 15 rotates much more slowly than the first turning roll 14. It also turns in the clockwise direction, i.e., in the direction of arrow 22 opposite the direction of conveying which is given by arrow 23. While the second turning roll 15 rotates at about three to four revolutions per minute, the first turning roll 14 can reach speeds of about 30 revolutions per minute.

The pull rods 9 in the region of the turning rolls 14, 15 have their ends guided in U-shaped profiles 26,26', i.e., the U-shaped profiles determine the path of motion of the pull rods 9. In this way the path of motion of the pull rods and with it also the path of motion of the printing plates 10 pulled by them can be essentially configured independently of the force of gravity so that the printing plates are pulled with the necessary force against the turning rolls 14, 15. In this way the moist cleaning and the subsequent drying can be performed to a satisfactory degree.

After leaving the washing device 1, not only the relief formed on the image side of the printing plate 10 but also the printing plate 10 itself is cleaned on its back side and is in a moist but essentially hand dry state.

In summary, the device 1 is for washing out flexographic printing plates 10, 10' with a large number of rotating brushes 5 which are at least partly immersed in a liquid bath in a tank 3 and with a turning roll 14 arranged behind the brushes 5 in the first direction of conveying which changes the direction of motion of the printing plates 10.

In the device 1, the cleaning of the printing plates 10, 10' is improved over the prior art.

For this purpose, the turning roll 14 is designed as a cleaning brush which cleans the back side of the printing plates 10, 10'.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. A device for washing out flexographic printing plates, the device comprising:
 a tank for holding a liquid bath,
 a large number of rotatable brushes adapted to be at least partly immersed in the liquid bath, the brushes for washing front sides of the plates,
 a first turning roll, and
 a plate conveying mechanism for conveying the plates in a first conveying direction past the rotatable brushes where the front sides of the plates are cleaned by the brushes and then partially around the first turning roll changing the direction of motion of the printing plates,
 characterized by the fact that the turning roll is designed as a cleaning brush which is adapted to clean back sides of the printing plates.

2. The device of claim 1, characterized by means for driving or rotating the conveying mechanism and the turning roll such that the circumferential velocity of the turning roll is different from the velocity of motion of the printing plates.

3. The device of claim 1, characterized by the fact that the turning roll is adapted to rotate in a direction opposite to the first conveying direction.

4. The device of claim 1, characterized by the fact that a brush roll is provided which engages the turning roll in the absence of printing plates, the brush roll adapted to be at least partly immersed in the liquid bath.

5. The device of claim 4, characterized by the fact that the brush roll is coordinated with a wiper which strips the liquid off it.

6. The device of claim 5, characterized by means for lifting the wiper away from the brush roll.

7. The device of claim 6, characterized by means for driving the turning roll and the brush roll such that the circumferential velocities of the turning roll and the brush roll differ from one another.

8. The device of claim 1, characterized by the fact that the conveying mechanism is adapted to convey the plates from the first turning roll to and partially around a second turning roll which turns the printing plates into a second conveying direction essentially the opposite direction to the first conveying direction, the second turning roll being designed as a drying roll.

9. The device of claim 8, characterized by the fact that the second turning roll has a surface of textile material.

10. The device of claim 8, characterized by means for driving the second turning roll such that the second turning roll rotates in a direction opposite to the first and second conveying directions.

11. The device of claim 10, characterized by the fact that the driving means also drives the first turning roll and rotates the second turning roll more slowly than the first turning roll designed as a cleaning brush.

12. The device of claim 1, characterized by the conveying mechanism including a plurality of pull rods such that each printing plate can be affixed to one of the pull rods which in a region of the first turning roll is guided with rod ends in a U profile.

13. The device of claim 1, characterized by the fact that the conveying mechanism includes a belt and a lifting mechanism for moving the rotatable brushes with respect to the belt and the printing plates, thus making the distance between the brushes and the belt variable.

14. The device of claim 1, characterized by the fact that at least one lifting mechanism is provided to vary the immersion depth of the brushes in the liquid bath.

15. The device of claim 1, characterized by the fact that means for driving the brushes is provided such that the brushes can oscillate at a frequency of about 80 cycles per minute transversely to the direction of conveying and rotate at a speed of about 30 revolutions per minute.

* * * * *